United States Patent
Helms

(10) Patent No.: US 9,819,316 B2
(45) Date of Patent: Nov. 14, 2017

(54) APPARATUS AND METHOD FOR GALLIUM NITRIDE (GAN) AMPLIFIERS

(71) Applicant: Lockheed Martin Corporation, Bethesda, MD (US)

(72) Inventor: David R. Helms, Tyngsboro, MA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/133,689

(22) Filed: Apr. 20, 2016

(65) Prior Publication Data

US 2016/0308498 A1    Oct. 20, 2016

Related U.S. Application Data

(60) Provisional application No. 62/149,876, filed on Apr. 20, 2015.

(51) Int. Cl.
| | |
|---|---|
| H03F 3/04 | (2006.01) |
| H03F 3/193 | (2006.01) |
| H03F 3/195 | (2006.01) |
| H03F 1/30 | (2006.01) |
| H01L 29/20 | (2006.01) |

(52) U.S. Cl.
CPC ............ *H03F 3/193* (2013.01); *H03F 1/301* (2013.01); *H03F 3/195* (2013.01); *H01L 29/2003* (2013.01); *H03F 2200/165* (2013.01); *H03F 2200/18* (2013.01); *H03F 2200/447* (2013.01); *H03F 2200/451* (2013.01)

(58) Field of Classification Search
CPC .................................. H03F 3/19; H03F 3/193
USPC ................. 330/296, 282, 285, 277, 301–306
See application file for complete search history.

(56) References Cited

U.S. PATENT DOCUMENTS

| | | | |
|---|---|---|---|
| 4,518,871 A | * | 5/1985 | Toyoda .............. H03K 19/094 |
| | | | 326/116 |
| 4,896,121 A | | 1/1990 | Larson |
| 5,032,799 A | | 7/1991 | Milberger et al. |
| 5,155,449 A | | 10/1992 | Ito |
| 5,166,553 A | | 11/1992 | Kotera et al. |
| 6,255,897 B1 | | 7/2001 | Klemmer |
| 6,259,324 B1 | | 7/2001 | Antognetti et al. |
| 7,847,636 B2 | | 12/2010 | Cha et al. |
| 7,956,692 B2 | | 6/2011 | Jeong et al. |
| 8,368,451 B2 | | 2/2013 | Mulawski et al. |
| 8,947,154 B1 | | 2/2015 | Shah et al. |

OTHER PUBLICATIONS

Yamauchi, K., et al., "X-Band MMIC Power Amplifier With an On-Chip Temperature-Compensation Circuit", IEEE Transactions on Microwave Theory and Techniques, vol. 49, No. 12, Dec. 2001, pp. 2501-2506.

(Continued)

*Primary Examiner* — Khanh V Nguyen
*Assistant Examiner* — Khiem Nguyen
(74) *Attorney, Agent, or Firm* — Howard IP Law Group PC

(57) ABSTRACT

A wide bandgap voltage reference circuit generates a temperature stable negative bias reference voltage for use in wide bandgap circuits. The reference circuit uses field effect transistor (FET) based source feedback. It can also be used as source feedback in high power high bandgap device applications, where constant current is required over process and thermal variations.

17 Claims, 5 Drawing Sheets

(56) References Cited

OTHER PUBLICATIONS

Wong, K., etal., "Integrated Voltage Reference Generator for GaN Smart Power Chip Technology", IEEE Transactions on Electron Devices, vol. 57, No. 4, Apr. 2010, pp. 952-955.
Yamanaka, K., et al., "Ku-band Low Noise MMIC Amplifier with Bias Circuit for Compensation of Temperature Dependence and Process Variation", Microwave Symposium Digest, 2002 IEEE MTT-S International, vol. 3, Jun. 2, 2002, pp. 1427-1430.
Gray, et al., "Analysis and Design of Analog Integrated Circuits", 5th Ed., John Wiley & Sons, Inc, 2009, pp. 272-275.
International Search Report dated Jul. 21, 2016 for related International Application No. PCT/US16/28524.

* cited by examiner

APPARATUS AND METHOD FOR GALLIUM NITRIDE (GAN) AMPLIFIERS

CROSS REFERENCE TO RELATED APPLICATIONS

This application claims the benefit of priority under 35 U.S.C. §119(e) of U.S. Provisional Application Ser. No. 62/149,876 filed on Apr. 20, 2015, which is incorporated by reference herein in its entirety for all purposes.

FIELD OF THE INVENTION

This application relates to semiconductor amplifiers. More particularly, the application relates to providing a bias voltage to a gallium nitride (GaN) based amplifier.

BACKGROUND OF THE INVENTION

Gallium Nitride (GaN) monolithic microwave integrated circuit (MMIC) biasing requires each individual MMIC to be biased independently at its own distinct gate bias voltage. This individual biasing of each die increases the cost of assembly, testing, and use. GaN gate bias voltage may vary across a range of bias voltages that is larger and more sensitive than traditional biasing techniques resolve. GaN devices belong to a family of semiconductors known as wide-band semiconductors. Wide band gap semiconductors refer to materials with band gaps significantly greater than those of commonly used materials such as silicon (Si) or gallium arsenide (GaAs), by way of example.

Biasing a field effect transistor (FET) of a MMIC requires applying a voltage level (e.g. bias voltage) to the gate of the FET, which causes a desired current to flow between the source and drain of the FET during a quiescent state of the FET. Due to differences within semiconductor wafers and fabrications processes, each FET fabricated from a given semiconductor wafer requires its own particular (unique) bias voltage. The bias voltage required for a particular FET is determined by production testing at the foundry. The tested FETs are binned according to their identified bias voltage levels. When the FET is installed in a circuit, the circuit must be designed to account for the FET's required bias voltage to ensure proper operation.

One traditional approach for biasing a FET is the use of a voltage divider or "ladder". This approach utilizes resistors connected in series, with the gate of the FET to be biased connected between first and second resistors of the series-connected resistors (i.e. "ladder"). The series-connected resistor ladder is placed between a positive voltage source and ground. Bond pads are provided between adjacent resistors of the resistor ladder. A negative voltage source may be connected to a selected bond pad causing a voltage drop across each resistor between the selected bond pad and the positive voltage source. This creates a voltage level at the point between the first and second resistor at the point where the gate of the FET is connected to the resistor ladder. By selectively connecting the negative voltage source to one of the bond pads, a voltage level at the gate of the FET is produced in discrete steps based on the bond pad selected. In some applications, the discrete steps are in increments of about 0.2 volts. For FET applications using semiconductors such as silicon-based semiconductors or gallium arsenide (GaAs), the range of bias voltage levels is relatively small. This makes the discrete voltage steps of 0.2 volts achievable by a resistor ladder practical for providing bias voltages to these devices. However, when using semiconductors such as GaN, the difference in bias voltages required for FETs from a single semiconductor wafer may span several volts. Thus, a resistor ladder providing voltage steps of only fractions of a volt would require too many resistors and contact points to be practicable. During testing, because of the wide range of possible bias voltages required to accommodate the variance in GaN-based dies, many of the fabricated devices cannot achieve the necessary bias voltage and fail production testing. These failed components are discarded. Accordingly, high failure rates have a detrimental effect on yield and overall costs.

Biasing GaN MMICs adds complexity to the assembly, testing and implementation of designs using these types of semiconductor devices. As stated above, each MMIC must be biased according to its own specific gate voltage. Traditional self-biasing techniques, such as resistor ladders, cannot be used in GaN devices because of the wide range of bias voltage levels needed across GaN devices. Using the voltage ladder described above, each MMIC is typically wired to a voltage tap determined during production testing to provide the approximate required bias voltage. GaN devices require more taps than is generally feasible. To accommodate the number of taps and resistors needed, additional design and customization of assemblies is frequently required. These approaches are expensive and require a significant amount of additional labor. Adding to these disadvantages, as the MMIC bias level shifts toward the edge of a voltage bin, performance of the MMIC degrades.

Savings can be achieved by reducing the area currently required for extensive bias ladder systems. Smaller, less costly chips should result in less expensive aggregated modules. This becomes even more important as system operating frequencies increase and arrays dictate smaller and smaller RF modules.

FIG. 1 shows a conventional biasing technique using a source resistor 101 coupled to the output transistor 105. Field effect transistors (FETs) require a gate voltage more negative than the source voltage. Bias circuit 100 achieves a gate-source bias by providing a source resistor 101 connected to the source 103 of FET 105. Current through source resistor 101 generates a source voltage that is greater than the voltage at the gate 107. Grounding the gate 107 via inductor 109 forces the gate bias voltage below the source voltage. The desired gate-source voltage differential will determine the resistance value of source resistor 101. For GaN transistors, gate-source voltages as high as three volts may be required, which in turn, require a large source resistor. However, large source resistance results in lower amplifier gain and power output. Gain may be determined by the ratio of the drain to source resistance values ($R_d/R_s$). Thus, a large $R_s$ will lower gain. Furthermore, a large source capacitor 111 can result in FET oscillation. $R_s$ can be minimized by use of a source capacitor 111 connected in parallel to the source resistor 101. However, the large source resistance required by GaN transistors forces the use of a large source capacitor 111. Large source capacitor 111 applies large amounts of negative source resistance, which causes FET 100 to oscillate as the voltage at source 103 varies with respect to the voltage at gate 107.

Also the current handling capacity of resistor 101 will limit the size of GaN transistor 103. For example, in an integrated circuit such as a MMIC the current handling capability of resistor 101 is limited to 0.9 mA/um. The maximum resistor width is generally 100 um so the GaN transistor is limited to 90 mA. This is too small to be useful in a power amplifier application. A second example in a discrete assembly a large resistor 101, can handle currents as high as 1 amp, but such a resistor 101 will be so large that the maximum frequency will be practically limited to less than one GHz.

FIG. 2 shows a conventional bias circuit 200 which includes temperature compensation. A reference FET 201 is connected to a positive voltage source 211 at its drain by a pair of series connected Schottky diodes 209. The reference FET 201 is connected to a negative voltage source 205 at its gate 203. The source of the FET 201 is connected to the negative voltage source 205 via a pair of series connected Schottky diodes 207 for producing a source voltage that is greater than the gate voltage. A voltage drop created by current flowing through Schottky diodes 209 produces a bias voltage level 213, which is applied to the gate of a radio frequency (RF) FET. Bias circuit 200 does not allow for different drain currents. Additionally, bias circuit 200 does not provide a level shift, which is necessary to drive common source devices. Moreover, the use of Schottky diodes 207, 209 increases processing costs. Also the current handling capacity of diodes 207 and 209 will limit the size of GaN transistor 303. For example, in an integrated circuit such as a MMIC the current handling capability of diodes 207 and 209 is limited to 0.1 mA/um. The maximum diode width is generally 100 um so the GaN transistor is limited to 10 mA. This is too small to be useful in any amplifier application.

Alternative systems and methods for self-biasing of a GaN transistor are desired.

SUMMARY

A biasing circuit is configured to provide a bias voltage to a gate of an output GaN-based RF FET. The biasing circuit includes a positive voltage source and a first reference FET having a drain electrode connected to the positive voltage source via a first resistor. An electrical node between the first resistor and the drain of the reference FET is connected to the gate of the output wide band gap or GaN FET, thereby providing the bias voltage to the output FET. A second reference FET exhibiting a variable resistance value is connected between the source of the first reference FET and a negative voltage source to provide a resistance value that produces a desired or target bias voltage level at the electrical node at the drain of the reference FET. The biasing voltage at the electrical node is applied to the gate of the output (e.g. RF) GaN-based FET through a resistor that is configured as an externally adjustable voltage level shifter. A filter resistor at the gate of the output wide band gap FET is configured to have a resistance value of greater than or equal to about 0.1 kilo-ohms (kΩ). A capacitor to provide AC filtering between the DC reference FET and the AC (e.g. RF) output GaN-based FET is connected between the electrical node and the externally adjustable voltage level shifter resistor. The capacitor filters out RF voltage signals produced by the output RF FET and isolates the RF voltage from the DC reference FET circuit. A level shift resistor connected between a negative voltage source and the filter resistor provides an external level shifting of the bias voltage.

In one embodiment, an enable FET for controlling power to the DC reference FET and RF output FET is electrically connected to an enable pin. Connecting the enable pin to ground turns off the enable FET, thereby allowing the biasing circuit to operate. When the voltage level at the enable pin is allowed to float, the enable FET is turned "on", thereby driving the gate of the RF FET to a negative bias voltage. The negative bias pinches off the gate of the RF FET, thereby turning "off" the RF FET.

According to another embodiment, a circuit for providing bias to an output Gallium Nitride (GaN) field effect transistor (FET) includes a radio frequency (RF) input signal applied to a gate electrode of the output GaN FET and a positive voltage source connected to a drain electrode of the output GaN FET. A reference voltage is connected to a source electrode of the output GaN FET. A reference FET is disposed between the source electrode of the output GaN FET and the reference voltage, the reference FET having a drain electrode connected to the source electrode of the output GaN FET, a gate electrode connected to the source electrode of the output GaN transistor via a resistor, and a source electrode connected to the reference voltage. A negative voltage source connected to the gate electrode of the output GaN FET via a filtering resistor and a filtering inductor. A node for producing an RF output is located between the positive voltage source and the drain electrode of the output GaN FET and a filtering inductor is disposed between the positive voltage source and the node producing the RF output. A filtering capacitor between the node producing the RF output and a terminal providing an output signal of the output GaN FET may be provided.

BRIEF DESCRIPTION OF THE DRAWINGS

The accompanying description may be better understood with reference to the accompanying drawings in which.

DETAILED DESCRIPTION

Figure 1:
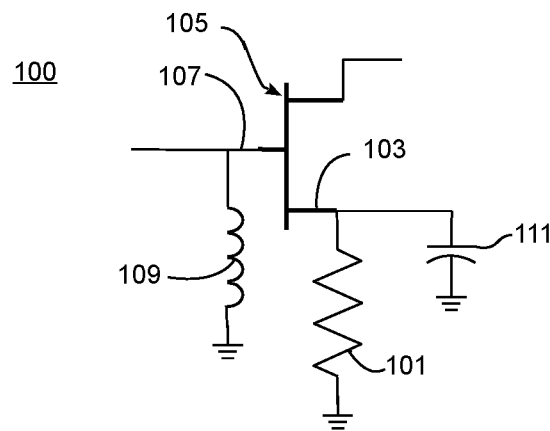
FIG. 1 shows a conventional bias circuit for a FET including a source resistor connected to the source electrode of the FET.
Figure 2:
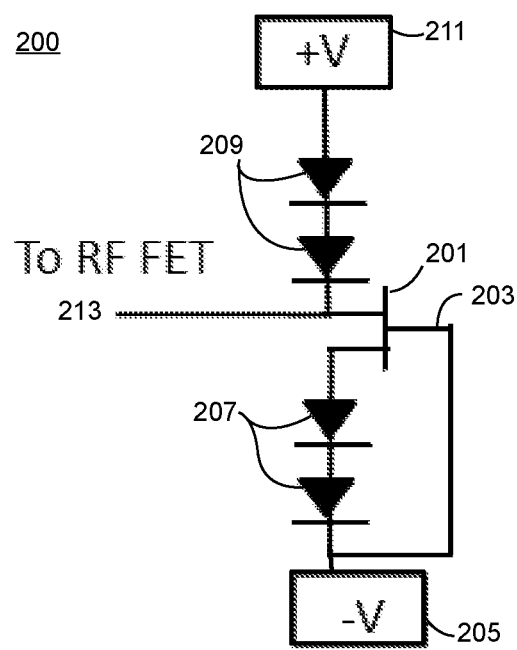
FIG. 2 shows a conventional bias circuit, which uses Schottky diodes to produce a bias voltage.

The use of gallium nitride (GaN) as a substrate material for semiconductor transistors provides performance gains. For example, high electron mobility of GaN substrates improves performance, particularly in high frequency applications such as monolithic microwave integrated circuits (MMICs). However, variations in GaN devices during fabrication result in poor yields from GaN wafers, which are typically smaller than other substrate wafers, such as silicon-based or gallium arsenide (GaAs). For example, transistors fabricated from a semiconductor wafer (e.g. GaN) are tested to determine their required bias voltage level. Different parts will experience drift and require different bias voltages. The parts are then binned according to their required bias voltage, grouping the parts according to the bias voltage at which they will operate correctly. Certain parts will exhibit bias voltages outside a range of typical bias voltage values, and are generally discarded. When using GaN as the semiconductor material, 15%-40% of the parts may be discarded. By providing a wider range of correctible bias voltage bins, fewer parts are discarded resulting in less waste and economic savings. The ability to provide bias voltages to accommodate processing variations in GaN substrates provides a tremendous advantage by significantly improving the yield in GaN-based circuits.

In terms of repeatability, the fabrication processing of GaN structures is not as mature as gallium arsenide processes. For gallium arsenide, an AlGaAs etch stop layer may be used. When an extremely strong acid, for example hydrofluoric acid, is applied to the substrate, the acid will etch up to the etch stop layer. This method allows the penetration into the channel to be very accurately defined. However, when using GaN, conventional etch stop layers cannot be used. As a result, the channel (e.g. the height of the channel) in GaN devices varies due to inconsistencies in the etching process. The channel thickness is typically only on the order of angstroms. Therefore, it often proves difficult to obtain acceptable process uniformity in GaN devices.

To address or overcome these inconsistencies, compensation bias voltage must be applied to GaN devices to ensure proper operation. The compensation bias voltage requires the GaN device to operate such that the device's drain current is maintained at a consistent level. Compensation methods according to embodiments described herein provide compensation for GaN devices fabricated from different processes, wafers and lots. In an embodiment, temperature compensation is applied to a reference bias voltage. The reference bias voltage may be level shifted and applied to the gate of a GaN device, for example a GaN amplifier used in an MMIC. The gate bias voltage for the output GaN-based amplifier is generated by a source resistor coupled to a second reference amplifier. The reference source resistor produces a reference voltage level at the source lead of the reference amplifier. The reference voltage level may be compensated for temperature according to an embodiment and/or amplified and fed to an output GaN-based FET, for example a radio frequency (RF) GaN-based FET of an MMIC. The reference bias voltage generated by the source resistor may be used to provide compensation in GaN devices across different processes and dies. Use of these biasing techniques improves yields in GaN devices and lowers the cost of fabrication and assembly.

Figure 3:
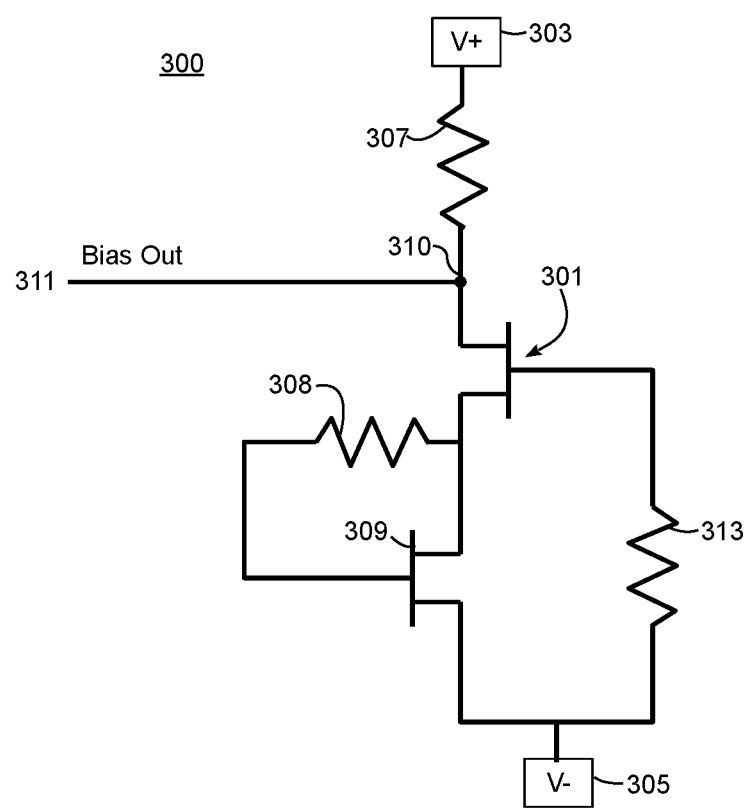
FIG. 3 illustrates a bias circuit according to an embodiment of the disclosure using two voltage sources.

FIG. 3 shows a reference bias voltage circuit 300 according to an embodiment of the disclosure. The bias voltage circuit 300 includes two power or voltage supplies 303, 305. A positive voltage supply 303 is connected to the drain electrode of a reference FET 301 via a series connected resistor 307. In an embodiment, reference FET 301 may be comprised of a wide band gap semiconductor, such as GaN. An electrical node 310 connects the drain electrode and resistor 307 and provides a voltage level that is applied to the gate of a GaN FET (via Bias Out 311) to provide a required bias voltage for the GaN FET. The gate electrode of reference FET 301 is connected to a negative voltage supply 305 via resistor 313. Negative voltage supply 305 is also connected to the source electrode of a second FET 309. The drain electrode of second FET 309 is connected to the source of reference FET 301. The gate of transistor 309 is connected to the drain of transistor 309 via resistor 308. A voltage drop across second FET 309 provides a voltage level at the source electrode of reference FET 301 which is greater than the voltage level at the gate electrode of reference FET 301. The voltage drop across transistor 309 (e.g. the resistance across FET 309) may vary with temperature. That is, second FET 309 controls current flow through the reference FET 301 as a function of temperature. This in turn, regulates the bias to the RF output FET and provides improved temperature dependent characteristics. The current flowing through resistor 307 determines that voltage drop at electrical node 310, and ultimately the bias voltage level provided to the RF FET. It is notable that the two voltage sources (V+, V−) are of opposite polarity and used to properly implement the circuit shown in the present disclosure using the GaN FET, in contrast to other conventional arrangements such as a negative voltage source and a reference (ground) potential, which proved unworkable.

The resistance value across second FET 309 provides gain control to reference FET 301. The gain of reference FET 301 may be affected by temperature. The selection of the resistance values of resistor 307 and the resistance across FET 309 allows for control of the thermal slope of the gain of reference FET 301. The positive voltage from voltage supply 303 produces a potential difference between positive voltage supply 303 and negative voltage supply 305, which allows a wide selection of resistance values for resistor 307. The selection of resistance values not only determines the voltage value to be provided at node 310, but also defines the source to drain current that flows through reference FET 301. High current levels through reference FET 301 may cause heat to be generated at reference FET 301. This increase in temperature may adversely affect the gain characteristics of reference FET 301. Selection of the resistance values or resistors 307, and the desirable or target temperature characteristics across FET 309, and the ratio of the resistance between resistor 307 and FET 309 allows for control of the temperature gain response of the reference FET 301.

For example, according to one embodiment, positive voltage supply 303 is configured to provide a positive voltage of about +14 v. Other positive voltage values may be used as long as the positive voltage level does not exceed the breakdown voltages of FETS 301, 309. Negative voltage supply 305 may be configured to provide a negative voltage of about −2 v at node 311. Resistor 307 is selected to have a high resistance relative to resistance across FET 309. According to an embodiment, resistor 307 may be selected to have a resistance value of about 10 kilo ohms (kΩ) to about 30 kΩ; for example, a resistor of 30 kΩ may be used. FET 309 will have a smaller resistance value than resistor 307. For example, FET 309 may only have a resistance value of about 1000 to about 2000. For such an embodiment, the reference FET 301 will draw about 3 milliamps (mA) at the drain of reference FET 301, and about 3 mA at the gate of reference FET 301.

Through testing, the required bias voltage for the GaN transistor may be determined. Across different GaN wafers and dies, GaN transistors may exhibit bias voltage levels that vary across a wide span of voltage levels. In some cases, the variation may span several volts. The resistance across FET 309 may be configured to produce a desired current through resistor 307. The desired current across FET 309 causes a voltage drop across resistor 307 which produces a desired bias voltage level at electrical node 310.

Figure 4:
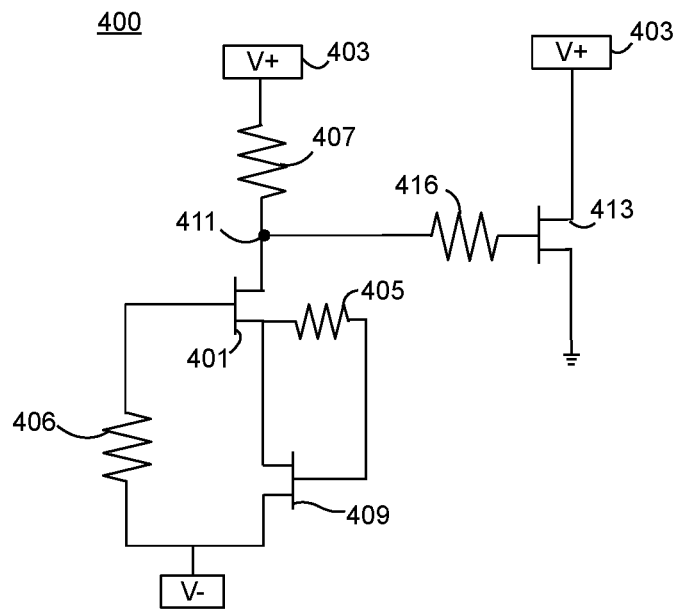
FIG. 4 illustrates a bias circuit similar to FIG. 3 and including an RF GaN FET according to an embodiment of the disclosure.

FIG. 4 is a schematic diagram of a bias circuit 400 for producing a bias voltage for an output GaN-based amplifier 413 according to an embodiment of the disclosure. The bias circuit (or network) 400 of FIG. 4 uses a positive voltage supply 403. The positive voltage supply 403 provides a positive voltage potential at a fixed voltage level producing a desired current level through reference FET 401 and a voltage drop at node 411. The reference FET 401 may be implemented using a wide band gap semiconductor, for example, GaN. The gate of reference FET 401 is connected to negative voltage supply 415 via resistor 406. The drain electrode of reference FET 401 is connected to the positive voltage supply 403 via resistor 407. The resistance value of resistor 405 is selected such that reference FET 401 is self-biased. The source of reference FET 401 is connected to a negative voltage supply 415 via second reference FET 409. The gate of second reference FET 409 is connected to the drain of second reference FET 409 via resistor 405. As the reference current passes through reference FET 401 and reference FET 409 from the positive voltage supply 403 to negative voltage supply 415, resistor 407 provides a voltage drop at node 411. The voltage drop across resistors 407 and second reference FET 409 produces a voltage level at node 411 between the drain of reference FET 401 and resistor 407. The voltage level at node 411 is used to bias output RF FET 413 via a filtering resistor 416.

The resistance values are selected to provide a desired gain of reference FET 401. The gain of reference FET 401 and second reference FET 409 may be affected by temperature. The selection of the resistance values of resistor 407 in combination with the current flow through second reference FET 409 allows for control of the thermal slope of the gain of reference FET 401. The positive voltage from positive voltage supply 403 produces a large voltage potential range between positive voltage supply 403 and negative voltage supply 415. This allows a wide selection of resistance values for resistor 407. The selection of a resistance value not only determines the voltage value that will be provided at node 411, but also defines the source to drain current that will flow through reference FET 401. High current levels through reference FET 401 may cause heat to be generated at reference FET 401. This increase in temperature may adversely affect the gain characteristics of reference FET 401. The use of second reference FET 409 whose current level is also dependent on temperature provides improved thermal characteristics for the bias network 400. Selection of the resistance values or resistor 307 and the ratio of the resistance between resistor 407 and effective resistance of second reference FET 409 allows for control the temperature gain response of the reference FET 401.

For example, according to one embodiment, positive voltage supply 403 is configured to provide a positive voltage of about +14 v. Negative voltage supply 415 may be configured to provide a negative voltage of about −2 v at node 411. Resistor 407 is selected to have a high resistance relative to second reference FET 409. According to an embodiment, resistor 407 may be selected to have a resistance value of about 0.1 kilo ohms (kΩ) to about 30 kΩ; for example, a resistor of 30 kΩ may be used. The effective resistance of second reference FET 409 may be selected to have a smaller resistance value than resistor 407. For example, second reference FET 409 may provide an effective resistance value of about 1000 to about 2000. For this embodiment, the reference FET 401 will draw about 3 milliamps (mA) at the drain of reference FET 401, and about 3 mA at the gate of reference FET 401 across resistors 406 and 416. The resistance value of resistor 405 is selected to control the gate to drain voltage of reference FET 401 and may be selected to provide a desired modulation of the bias at the gate of reference FET 401.

Figure 5:
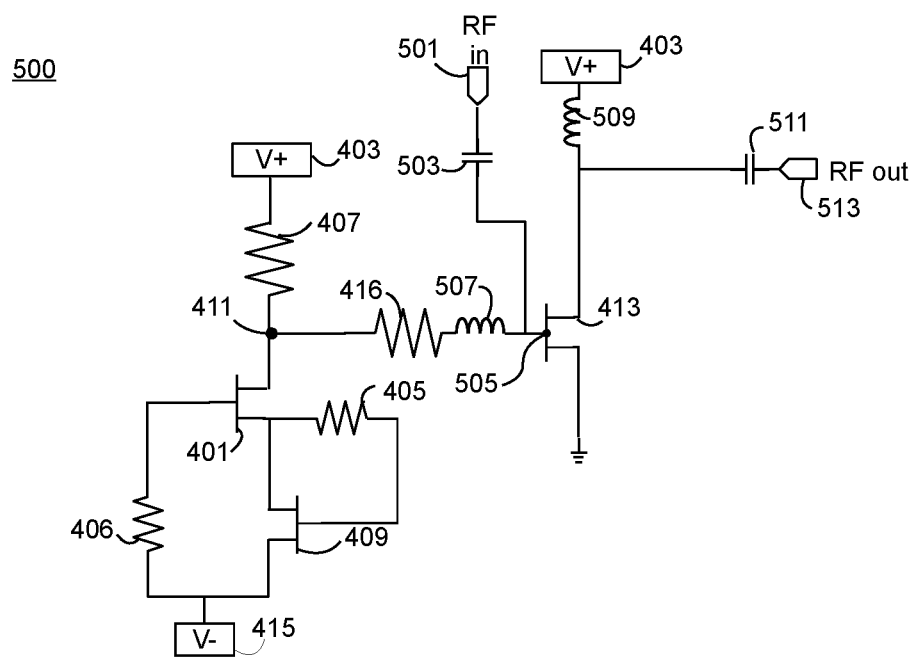
FIG. 5 shows the bias circuit of FIG. 4 further illustrating radio frequency (RF) input/output (I/O) connections according to an embodiment of the disclosure.

Referring now to FIG. 5, a schematic diagram of a bias network 500 comprising the bias network of FIG. 4 along with the RF input 501 and output 513 connections to the GaN-based output RF FET 413 is shown. Portions of the bias network 500 that are identical to components of bias circuit 400 of FIG. 4 are numbered identically and provide identical functionality as described above with regard to FIG. 4. Output GaN or wide band gap semiconductor RF FET 413 is self-biased via bias voltage applied to the gate of output RF FET 413 at node 505. In addition, an RF input signal 501 is received and applied via filtering capacitor 503 and inductor 507 to the gate of output RF FET 413 at node 505. The filter comprising capacitor 503 and inductor 507 prevents noise from the biasing network from introducing spurious noise or interference to output RF FET 413. The RF input signal 501 further biases the output RF FET 413 and is amplified, affecting the current flowing through the output RF FET 413. The amplified signal is filtered by output filter comprising inductor 509 and capacitor 511 to produce an RF output signal 513.

Figure 6:
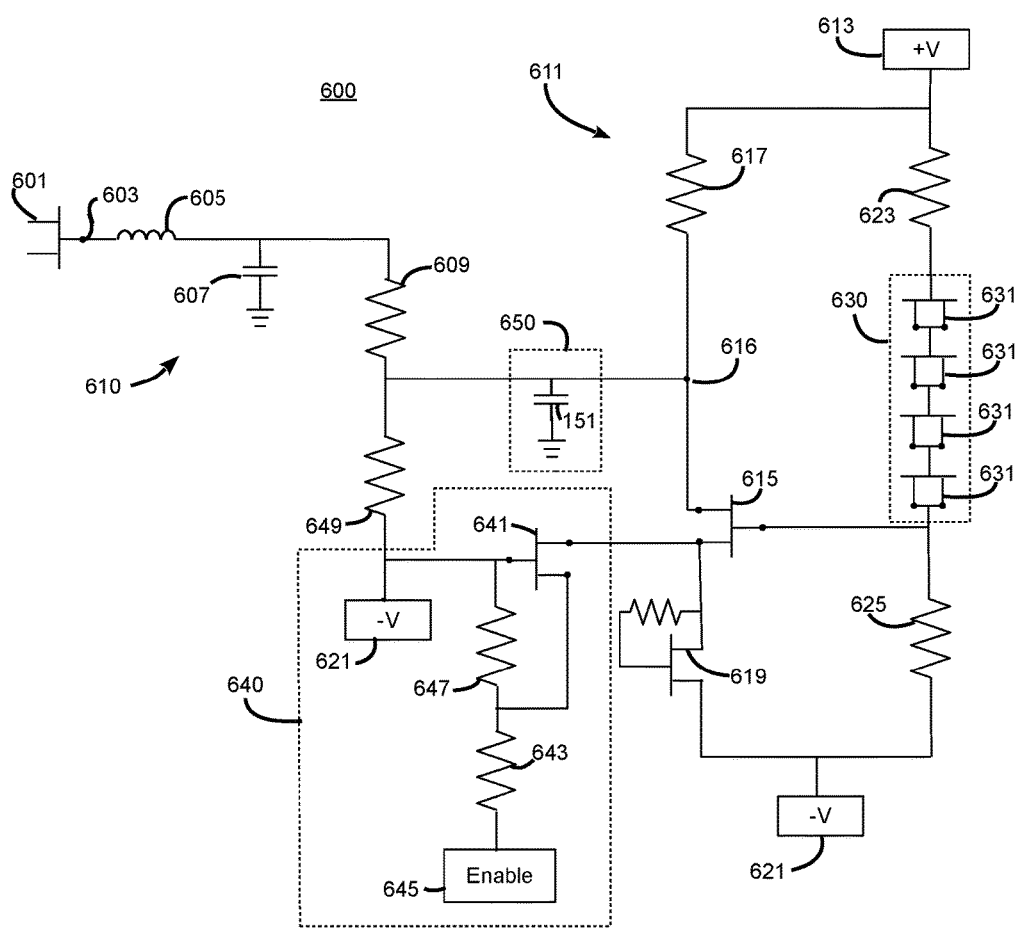
FIG. 6 shows a bias circuit for providing bias voltage to a GaN FET, the circuit including temperature compensation and an enable circuit according to an embodiment of the disclosure.

FIG. 6 is a schematic block diagram of a reference bias circuit 600 for an RF wide band gap FET 601. The reference bias circuit 600 includes a reference FET 615 that is connected between a positive voltage supply 613 and a negative voltage supply 621. The drain electrode of reference FET 615 is connected to the positive voltage supply 613 by a resistor 617. The source electrode of reference FET 615 is connected to the negative voltage supply 621 via a second reference FET 619. Second reference FET 619 creates an effective resistance value as the reference current passes through reference FET 613 and second reference FET 619. The gate electrode of reference FET 615 is connected to negative voltage supply 621 via resistor 625 and is further connected to positive voltage supply 613 via resistor 623.

Resistor 617, reference FET 615 and second reference FET 619 are connected in series between the positive voltage supply 613 and negative voltage supply 621. Resistor 617 and the effective resistance of second reference FET 619 define a voltage divider, which provides a voltage level at electrical node 616 between the drain of reference FET 615 and resistor 617. The resistance values are selected to provide a desired gain of reference FET 615. The gain of reference FET 615 may be affected by temperature. The selection of the resistance values of resistor 617 and the effective resistance of second reference FET 619 allows for control of the thermal slope of the gain of reference FET 615. The positive voltage from positive voltage supply 613 produces a difference in voltage potential between positive voltage supply 613 and negative voltage supply 621, which allows a wide selection of resistance values for resistor 617. The selection of the resistance values not only determines the voltage value provided at node 616, but also defines the source to drain current that will flow through reference FET 615. High current levels through reference FET 615 may cause heat to be generated at reference FET 615. This increase in temperature may adversely affect the gain characteristics of reference FET 615. Selection of the resistance values or resistors 617 and the effective resistance provided by second reference FET 619 and the ratio of the resistance between resistor 617 and effective resistance of second reference FET 619 allows for control the temperature gain response of the reference FET 615.

For example, according to one embodiment, positive voltage supply 613 is configured to provide a positive voltage of about +14 v. Negative voltage source 621 may be configured to provide a negative voltage of about −2 v at node 616. Resistor 617 is selected to have a high resistance relative to the effective resistance of second reference FET 619. According to an embodiment, resistor 407 may be selected to have a resistance value of about 10 kilo ohms (kΩ) to about 30 kΩ, for example, a resistor of 30 kΩ may be used. The effective resistance of second reference FET 619 may be a smaller resistance value than resistor 617. For example, the effective resistance of second reference FET 619 may have a resistance value of about 100Ω to about 200Ω. For this embodiment, the reference FET will draw about 3 milliamps (mA) at the drain of reference FET 615, and about 3 mA at the gate of reference FET 301.

In addition to the improved temperature characteristics provided by second reference FET 619, reference bias circuit 600 includes an additional temperature compensation mechanism 630, which provides compensation for temperature fluctuations. As temperature changes, the resistance values of resistors 617, 623 and 625 change, as well as the resistance and gain characteristics of reference FET 615 and second reference FET 619. A group of diode-connected FETs 631 is connected in series between resistor 623 and the gate electrode of reference FET 615. In an embodiment, diode-connected FETs 631 are wide band gap semiconductor FETs, such as GaN. As temperature changes, the resistance value and voltage drop of diode-connected FETs 631 changes, thereby modulating the voltage level at the gate of reference FET 615 and changing the bias of the reference FET 615. The modulation of the bias voltage of reference FET 615 affects the gain of reference FET 615 and the voltage provided at node 616 as a result of the source-drain current flowing through reference FET 615, thus compensating for the effects of temperature changes to produce a desired voltage at node 616.

The voltage at node 616 is provided to the gate of an output wide band gap (e.g. GaN) RF FET 601. The input to gate 603 of RF FET 601 is filtered by inductor 605, capacitor 607 and resistor 609 as known in the art. According to one embodiment, filter resistor 609 is selected to have a resistance value equal to or greater than about 10 kilo-ohms (kΩ). By selecting a high resistance value of at least 10 kΩ, robustness of the circuit is greatly enhanced. Smaller values of resistance typically used in RF circuits, for example 10-100Ω, tend to suffer failure sooner and exhibit a shorter mean time before failure (MTBF) than circuits using a higher value resistor for filter resistor 609.

At times, the voltage provided at node 616 may not provide the needed voltage to properly bias wide band gap RF FET 601 to an quiescent state. The bias voltage required to compensate for variance in GaN-based devices may span a number of volts. To produce the needed bias voltage, a level shifter is provided which amplifies and level shifts the voltage produced at node 616 by reference FET 615. Level shifting is provided by defining a voltage divider along the conductive path between positive voltage supply 613, through resistor 617 to node 616 from node 616 to resistor 649 and to negative voltage supply 621. Resistors 617 and 629 thereby define a voltage divider, which produces a voltage at node 616, is the voltage being level shifted and applied to gate 603 of RF FET 601. The level of bias voltage needed may be determined through testing of the GaN device during fabrication. The voltage obtained at node 616 may be selected by controlling the amount of reference current passing through resistor 617 and reference FET 615. A filter capacitor 650 is provided between node 616 and the gate 603 of RF FET 601 to filter unwanted RF signals from RF FET 601 from reaching the DC portions of reference bias circuit 600 including reference FET 615.

Reference bias circuit 600 further includes an enable circuit 640, which includes an enable wide band gap FET 641 having its drain connected to the source of reference FET 615. Enable FET 641 has a gate electrode connected to negative voltage supply 621. The gate of enable FET 641 is further connected to enable pin 645 via two series connected resistors 647, 643. The source of enable FET 641 is connected between resistor 647 and resistor 643. When FET 641 is in a conducting state, FET 641 shunts resistor 619, causing the voltage drop at node 616 due to the resistance of resistor 619 to be eliminated. As a result, the negative voltage level provided by negative voltage source 621 is applied to the gate of wide band gap RF FET 601. The negative bias voltage creates an electric field that pinches off the channel in wide band gap RF FET 601, effectively disabling or turning off RF FET 601. When enable pin 645 is connected via a low impedance connection to ground, negative voltage supply 621 puts a negative voltage potential on the gate of enable FET 641, pinching off the channel of enable FET 641 and placing it in a non-conducting state. In a non-conducting state of enable FET 641, the output RF FET 601 is enabled, RF FET 601 receives a proper level shifted bias voltage via electrical node 616. When the enable pin 645 is disconnected from ground (e.g. allowed to float), enable FET 641 is placed into a conducting state. In a conducting state, enable FET 641 shunts out resistor 619, causing a negative voltage level to be applied to the gate of output RF FET 601, effectively turning off the output RF FET 601. Thus, by controlling the connection of enable pin 645 with respect to ground, the output RF FET 601 can be selectively enabled or disabled.

Thus, in an embodiment there is disclosed a system and method that provides a temperature compensated reference voltage to an external RF FET. The technique uses a temperature compensated reference voltage followed by a level shift. The approach generates a gate bias voltage from a source resistor and modulates that voltage for temperature. That reference voltage is then level shifted to the needed (or target) voltage and fed to the RF FET via an externally adjustable voltage level shifter. This generated voltage moves with the process to insure a consistent operating voltage from process to process and die to die. This approach may significantly improve yield and lower assembly and die costs.

Thus, systems and processes associated with embodiments of the invention provide for a resistor based common source self bias network that is used as a GaN voltage reference source; a GaN voltage gate reference that has positive temperature compensation through use of GaN diode connected FETs; a GaN gate reference source having an external enable pin. The network provides a temperature compensated reference voltage to an external RF FET. A novel approach uses a temperature compensated reference voltage followed by a level shift. The approach generates a gate bias voltage from a source resistor, and modulates that voltage for temperature. That reference voltage is then level shifted to the needed voltage and fed to the RF FET via an externally adjustable voltage level shifter. This generated voltage moves with the process to insure a consistent operating voltage from process to process and die to die. This approach may significantly improve yield and lower assembly and die costs.

A temperature compensated reference voltage generator is disclosed having a commonly used source resistor self bias. From the prior art a source resistor biases a FET to a current that is formed by the source resistor size. In an embodiment, the network modulates that current for temperature using diode connected FETs. In addition, by connecting to the drain it becomes a reference voltage and is level shifted such that the voltage to use it provides a reference voltage for the RF FET. Further there is disclosed a second GaN FET that acts as an enable. When a low impedance ground is added to the enable pin it allows it to operate. When that enable pin is allowed to float the output to the RF FET is negative, and that RF FET is pinched off. Another part of the network embodied in the present disclosure includes four diode connected FETs. Diode connecting is accomplished by connecting drain to source. The diode connected FET acts as a thermal reference diode. That is, the diode's anode to cathode voltage drop shifts with temperature. This is used to force the network's output voltage to increase with rising temperature.

Figure 7:
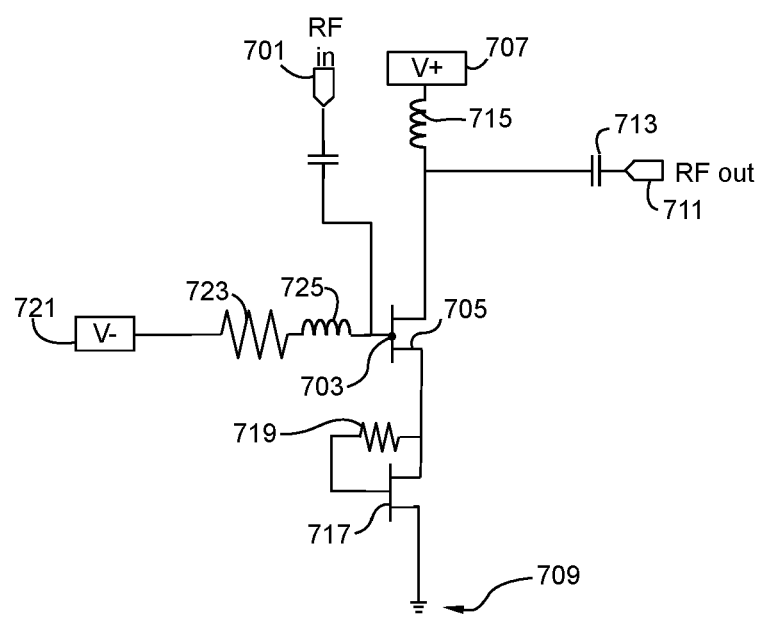
FIG. 7 is a schematic for a biasing circuit for providing bias voltage to a GaN FET according to an embodiment of the disclosure.

FIG. 7 is a schematic diagram of a biasing network 700 for providing a bias voltage to an RF amplifier according to an embodiment of the present disclosure. An RF input signal 701 is received, filtered via a capacitor and applied to the gate 703 electrode of an RF amplifier FET 705. The input RF signal 701 will affect the bias state of the RF amplifier FET 705 and cause the current passing through the drain and source of the RF amplifier FET 705 to vary with the input signal 701 applied to the RF amplifier FET's gate 703. A positive voltage source 707 is connected to the drain of RF amplifier FET 705 and the source electrode of RF amplifier FET 705 is connected to a reference voltage 709, such as ground as shown in FIG. 7. The difference in voltage potential between positive voltage source 707 and reference voltage 709 provides a current through RF amplifier transistor 705. As the RF input signal 701 varies and biases the RF amplifier transistor 705, a small change in input voltage is sufficient to vary a large current across the RF amplifier FET 705, producing an amplified signal representative of the RF input signal 701 at the drain of the RF amplifier FET 703 which serves as the RF output 711 of the amplifier. The RF output signal 711 may be filtered by capacitor 713.

A reference FET 717 is connected between the source of RF amplifier FET 705 and reference voltage 709. The gate of reference FET 717 is connected to its drain via resistor 719. The gate of reference FET 717 is connected to a negative voltage source 721 via filtering resistor 723 and filtering inductor 725. The biasing network 700 of FIG. 7 operates by controlling voltage via the reference FET 717 at the source electrode of the RF amplifier FET 705. By controlling the flow of current through the RF amplifier FET 705 via reference FET 717, the need for a separate biasing network on the gate side of the RF amplifier FET 705 is eliminated, allowing the biasing network 700 of FIG. 7 to be fabricated more simply, using fewer components. Further, as FET fabrication methods progress, FETs are being made having shorter gate lengths. Because the biasing network 700 of FIG. 7 utilizes the reference FET 717 at the source electrode of the RF amplifier FET 705, the ease of fabrication is not negatively impacted by FETs having shorter gate lengths. The biasing circuit 700 provides better RF performance as well. Reference FET 717 provides improved RF stability in high gain amplifiers such as RF amplifier FET 705. High gain devices experience a large amount of trans conductance. The biasing network 700 of FIG. 7 limits device gain to where the gain of the device equals the effective RF load from (715,713) divided by the effective source impedance of (resistor 719 and FET 717). The biasing network 700 further provides improved thermal characteristics. The bias level in reference FET 717 will vary as temperature changes. As temperature increases, the resistance exhibited by reference FET 717 will vary, thereby affecting the current level through output FET 705. In high power devices, the current drawn generates heat which can cause current runaway. The current passing through output FET 705 affects the bias level of reference FET 717 and is effective in controlling the amount of current through output FET 705 and preventing current runaway.

While the foregoing invention has been described with reference to the above-described embodiments, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that other arrangements calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An electronic circuit for providing a bias voltage to an output Gallium Nitride (GaN) field effect transistor (FET) comprising:
   a first reference GaN FET having a gate, a source and a drain electrode;
   a positive voltage supply connected to the drain electrode of said first reference GaN FET;
   a first resistor device having a first terminal end coupled to the drain electrode of the first reference GaN FET, and a second terminal end coupled to the positive voltage supply;
   a negative voltage supply coupled to said source electrode of said first reference GaN FET via a second reference GaN FET; and
   an output node terminal coupled to the first terminal end of the first resistor and the drain electrode of said first reference GaN FET for providing the bias voltage to said output GaN FET,
   wherein said gate electrode of said first reference GaN FET is coupled to said negative voltage supply via a third resistor, and said source electrode of said first reference GaN FET is coupled to said negative voltage supply via said second reference GaN FET, thereby producing a voltage level at said gate electrode that is less than a voltage level at said source electrode.

2. The circuit of claim 1, wherein said second reference GaN FET exhibits a resistance to produce a target bias voltage at said output node terminal.

3. The circuit of claim 2, wherein the resistance exhibited by said second reference FET varies with temperature.

4. The circuit of claim 3, wherein said second reference GaN FET has its gate electrode coupled to its drain electrode via a second resistor.

5. A reference bias circuit for providing a desired gate bias voltage to an output wide band gap field effect transistor (FET) comprising:
   a first reference FET having a gate electrode, a drain electrode coupled to a positive voltage supply, and a source electrode coupled to a negative voltage supply;
   a first resistor coupled between said drain electrode of said first reference FET and said positive voltage supply;
   a second reference FET coupled between said source electrode of said first reference FET and said negative voltage supply;
   an electrical node connecting said first resistor and said drain electrode of said first reference FET, and coupled to a gate electrode of said output wide band gap FET to provide a reference bias voltage thereto; and
   a plurality of diode-connected FETs connected in series between said positive voltage supply and said gate electrode of said first reference FET, said plurality of diode-connected FETs configured to produce a temperature dependent bias voltage at said gate electrode of said first reference FET, to thereby modulate a current between said drain electrode and said source electrode of said first reference FET based on temperature.

6. The reference bias circuit of claim 5, wherein each of said plurality of diode-connected FETs comprises Gallium Nitride (GaN).

7. The reference bias circuit of claim 5 further comprising:
   a level shifting resistor coupled between said electrical node and said negative voltage supply, wherein a conductive path is defined from said positive voltage supply through said first resistor, said electrical node and said level shifting resistor to said negative voltage supply.

8. The reference bias circuit of claim 5, further comprising:
   an enable circuit comprising:
      an enable FET having a gate electrode coupled to said negative voltage supply and to said gate electrode of said output wide band gap FET, a drain electrode coupled to said source electrode of said first reference FET, and a source electrode coupled to an enable pin; and
      a pair of series connected resistors connected between said gate electrode of said enable FET and said enable pin, wherein said source electrode of said enable FET is coupled to said enable pin at a node between a first resistor and a second resistor of said pair of series connected resistors.

9. The reference bias circuit of claim 8, wherein said enable FET comprises Gallium Nitride (GaN).

10. The reference bias circuit of claim 5, further comprising:
    a capacitor coupled between said gate electrode of said output wide band gap FET and a reference potential, wherein said capacitor is configured to filter out radio frequency (RF) signals applied at said gate of said output wide band gap FET and prevent said RF signals from reaching said electrical node coupled to said first reference FET.

11. The reference bias circuit of claim 5, wherein said output wide band gap FET comprises Gallium Nitride (GaN).

12. The reference bias circuit of claim 5, wherein said first reference FET comprises Gallium Nitride (GaN).

13. The reference bias circuit of claim 5, wherein said second reference FET comprises Gallium Nitride (GaN).

14. A circuit for providing bias to an output Gallium Nitride (GaN) field effect transistor (FET) comprising:
    a radio frequency (RF) input signal applied to a gate electrode of the output GaN FET;
    a positive voltage source connected to a drain electrode of the output GaN FET;
    a reference voltage connected to a source electrode of the output GaN FET;
    a reference FET between the source electrode of the output GaN FET and the reference voltage, the reference FET having a drain electrode connected to the source electrode of the output GaN FET, a gate electrode connected to the source electrode of the output GaN FET via a resistor, and a source electrode connected to the reference voltage; and
    a negative voltage source connected to the gate electrode of the output GaN FET via a filtering resistor and a filtering inductor.

15. The circuit of claim 14, further comprising:
    an RF output generated between the positive voltage source and the drain electrode of the output GaN FET.

16. The circuit of claim 15 further comprising a filtering inductor between the positive voltage source and the RF output.

17. The circuit of claim 16, further comprising:
    a filtering capacitor between the node producing the RF output and a terminal providing an output signal of the output GaN FET.

* * * * *